United States Patent [19]

Ozaki

[11] Patent Number: 5,578,186
[45] Date of Patent: Nov. 26, 1996

[54] METHOD FOR FORMING AN ACRYLIC RESIST ON A SUBSTRATE AND A FABRICATION PROCESS OF AN ELECTRONIC APPARATUS

[75] Inventor: Norikazu Ozaki, Kawasaki, Japan

[73] Assignee: Fujitsu Limited, Kanagawa, Japan

[21] Appl. No.: 400,563

[22] Filed: Mar. 8, 1995

[30] Foreign Application Priority Data

Mar. 16, 1994 [JP] Japan .................................. 6-045359

[51] Int. Cl.⁶ ............................................ C25D 5/02
[52] U.S. Cl. ........................ 205/125; 205/210; 205/215; 427/306; 430/311
[58] Field of Search ............................ 205/125, 122, 205/210, 215; 430/277, 954, 311; 427/306

[56] References Cited

U.S. PATENT DOCUMENTS 4,643,793  2/1987  Nakaso .................................. 156/306.6
4,861,438  8/1989  Banks .................................... 205/125

OTHER PUBLICATIONS

R. H. Clark, *Handbook of Printed Circuit Manufacturing* Van Nostrand Reinhold (New York), (1985) pp. 3–7 no month available.

Primary Examiner—Kathryn Gorgos
Assistant Examiner—Brendan Mee
Attorney, Agent, or Firm—Armstrong, Westerman, Hattori, McLeland & Naughton

[57] ABSTRACT

A method for forming an acrylic resist on a surface of a copper layer includes the steps of processing a surface of the copper layer by an ammonia water, and depositing a layer of acrylic resist on the surface of the copper layer after a processing by the ammonia water.

7 Claims, 3 Drawing Sheets

METHOD FOR FORMING AN ACRYLIC RESIST ON A SUBSTRATE AND A FABRICATION PROCESS OF AN ELECTRONIC APPARATUS

BACKGROUND OF THE INVENTION

The present invention generally relates to the fabrication of electronic apparatuses and more particularly to the process for forming an acrylic resist on a surface of a copper layer that forms a part of a substrate such as a printed circuit board carrying thereon a conductor pattern.

Electroplating process is used commonly in the fabrication of multilayer circuit substrate of electronic apparatuses. In the fabrication of such a multilayer circuit substrate or a circuit substrate in general, an acrylic resist layer is applied on the surface of a copper layer that forms a part of the multilayer circuit substrate, wherein such an acrylic resist layer is patterned by a photolithographic process to form a resist pattern. The resist pattern thus obtained is then used as a mask pattern when forming an interconnection pattern on the substrate by an electroplating process.

FIGS. 1A–1G show the process of formation of a conductor interconnection pattern on a substrate.

Referring to FIG. 1A, a copper layer 2 is formed on an insulating substrate 1 by a sputtering process and the like, as an electrode. In the electroplating process, it should be noted that the surface of the substrate has to be covered by a conducting film for providing the same an electric conductivity. In other words, the copper layer 2 acts as an electrode. As most of part of the copper layer 2 thus formed has to be removed later, the copper layer 2 is generally formed as thin as possible.

Next, an acrylic resist layer 3 is formed on the surface of the copper layer 2 in the step of FIG. 1B, wherein the acrylic resist, being a mixture of a resin and a photosensitive agent or a photosensitive resin dissolved in a solvent, adheres upon the copper layer 2.

It should be noted that such a photoresist may be any one of: (1) a negative resist in which exposed part of the resist causes a polymerization to become insoluble to a developer solution while the rest of the resist remains soluble to such a developer solution; and (2) a positive resist in which exposed part of the resist alone causes a decomposition to become soluble to a developer solution. Generally, the negative resist is suitable for formation of fine patterns on a thin film multilayer substrate. On the other hand, such a negative resist generally has a poor adherence upon the underlying electrode layer 2. A typical example of the negative resist is the acrylic resist described above.

After the formation of the acrylic resist layer 3, the substrate 1 is subjected to a pre-exposure bake process, followed by an exposure process in the step of FIG. 1C such that the resist layer 3 is exposed by ultraviolet radiation. As a result of the exposure, the pattern of a photomask 4 is transferred upon the acrylic resist 3.

Next, a development of the resist layer 3 is conducted in the step of FIG. 1D, wherein the unexposed part of the resist layer 3 is dissolved by a developer solution.

After the foregoing step of developing, the copper layer 2 is connected to a negative pole of a d.c. power supply and an electroplating of copper is conducted. Thereby, the deposition of copper occurs only on the exposed part of the copper layer 2 and a thick copper pattern 5 is formed thereon. On the other hand no deposition of copper occurs on the resist pattern 3. Typically, the copper pattern 5 has a thickness of about 10 times as large as the thickness of the copper layer 2 used for the electrode.

After the electroplating process of FIG. 1E, the acrylic resist pattern 3 is removed in the step of FIG. 1F. In the state of FIG. 1F, it should be noted that the copper layer 2 remains exposed between the copper patterns 5, and the copper patterns 5 are interconnected by the exposed copper layer 2 electrically.

Thus, in the step of FIG. 1G, an etching process is conducted uniformly over the structure of FIG. 1F to remove the exposed copper layer 2, wherein the etching is conducted for a limited duration such that the etching is terminated upon removal of the exposed copper layer 2.

Thus, the acrylic resist is suitable for the formation of fine, minute interconnection patterns of copper or other conductive material on a thin film multilayer substrate. On the other hand, such an acrylic resist has a problem in that the adherence upon the underlying copper layer is generally poor as already noted. Conventionally, improvement of adherence of a resist upon an underlying layer has been achieved by adherence agent. For example, 1,1,1,3,3,3-hexamethyldisilazane has been used for such adherence agent of rubber-base resist or Novorak resist, while this substance is not effective for improving the adherence of acrylic resist. In the case of acrylic resist, no effective adherence agent is known so far.

In the absence of the effective adherence agent, conventional fabrication process of substrates has suffered from the problem in that the acrylic resist layer 3 tends to come off from the surface of the electrode layer 2 upon the post-exposure bake process that is conducted after the exposure step of the acrylic resist shown in FIG. 1D. When an electroplating process is conducted in such a state, it will be noted that the electrolytic solution containing copper penetrates into the gap between the resist layer 3 and the electrode layer 2 and causes a deposition of a copper layer therein as indicated in FIG. 2. Once a deposition occurs in such a gap with a thickness larger than the thickness of the electrode layer 2, the copper layer in the gap cannot be removed completely even after the etching process of FIG. 1G is conducted to remove the exposed layer 2. Thereby, a short-circuit occurs between the copper patterns 5.

SUMMARY OF THE INVENTION

Accordingly, it is a general object of the present invention to provide a novel and useful process for forming an acrylic resist on a substrate and a fabrication process of an electronic apparatus that uses such a substrate, wherein the foregoing problems are eliminated.

Another and more specific object of the present invention is to provide a method for forming an acrylic resist on a surface of a copper layer with an improved adherence and a fabrication process of an electronic apparatus that uses such a substrate.

Another object of the present invention is to provide a method for forming an acrylic resist on a surface of a copper layer, comprising the steps of:

processing a surface of said copper layer by an ammonia water; and depositing a layer of acrylic resist on said surface of said copper layer after a processing by said ammonia water.

Another object of the present invention is to provide a method for fabricating an electronic apparatus that includes a substrate carrying thereon a conductor pattern, comprising the steps of:

depositing a first copper layer on a substrate;

processing a surface of said first copper layer by an ammonia water;

depositing a layer of acrylic resist on said surface of said first copper layer after said step for processing by said ammonia water;

exposing said layer of acrylic resist according to a desired conductor pattern to form a resist pattern of acrylic resist on said first copper layer;

depositing a second copper layer upon said first copper layer carrying thereon said pattern of acrylic resist by an electroplating process, while using said resist pattern as a mask;

removing said resist pattern after said step of depositing said second copper layer to expose said first copper pattern located underneath said resist pattern; and removing said first copper layer exposed after said step of removing said resist pattern.

According to the present invention, the adherence of the acrylic resist upon the surface of a copper layer is improved substantially by processing the surface of the copper layer by ammonia water. Although the mechanism of such an ammoniac processing is not fully understood, it is thought, at the present juncture, that one or both of the following mechanisms are working.

(A) The ammonia water reacts with the copper electrode layer to form a layer of complex compound on the surface of the copper electrode layer, while the layer of the complex compound thus formed reacts with the acrylic resist to develop a firm bond between the electrode layer and the acrylic resist layer.

(B) The ammonia water removes oxide or oxide films from the surface of the electrode layer, and the bare surface of the copper electrode layer thus exposed establishes a firm bond with the acrylic resist layer thereon.

Other objects and further features of the present invention will become apparent from the following detailed description when read in conjunction with the attached drawings.

DETAILED DESCRIPTION OF THE PREFERRED EMBODIMENTS

First, the principle of the present invention will be described with reference to FIGS. 3A–3C.

Figure 1A:
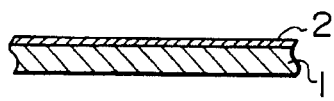
FIGS. 1A–1G are diagrams showing the conventional process for forming a substrate of an electronic device.
Figure 1B:
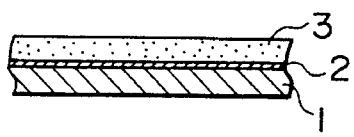
Figure 1C:
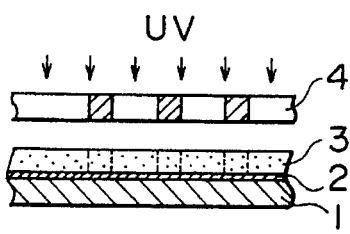
Figure 1D:
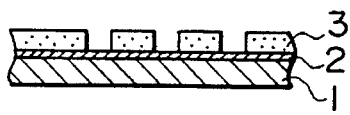
Figure 1E:
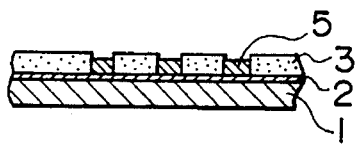
Figure 1F:
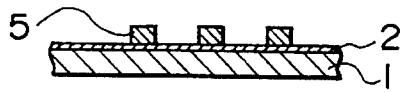
Figure 1G:
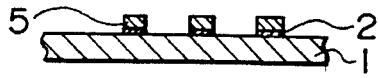
Figure 2:
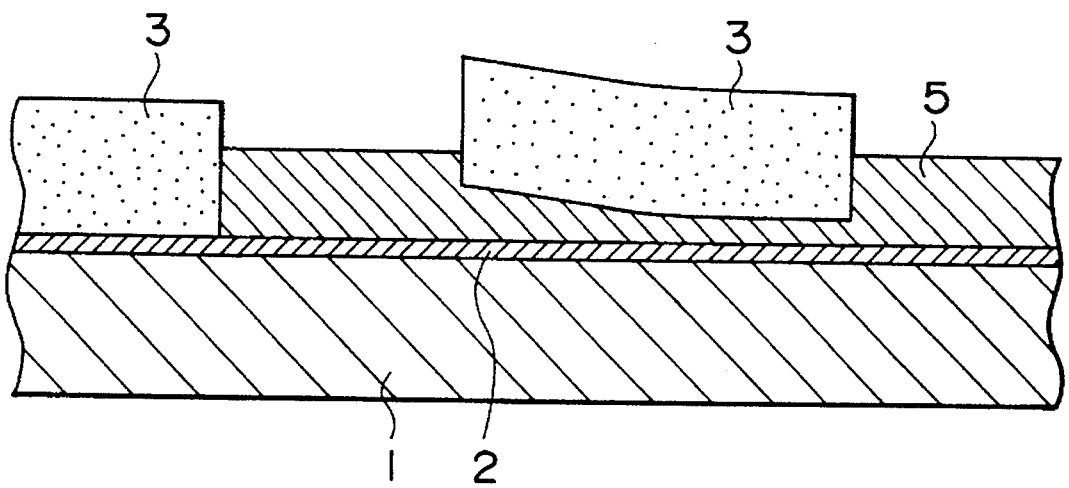
FIG. 2 is a diagram showing the problem pertinent to the conventional process of FIGS. 1A–1G.
Figure 3A:
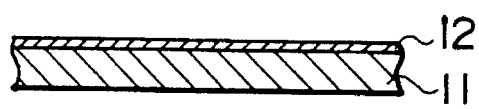
FIGS. 3A–3C are diagrams showing the principle of the present invention.

Referring to FIG. 3A, a copper layer 2 is formed on the surface of a substrate 11.

Figure 3B:
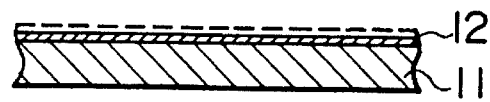
Figure 3C:
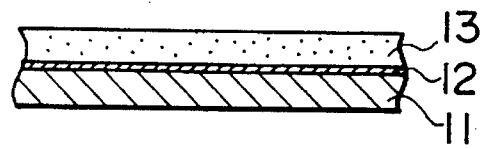

Next, in the step of FIG. 3B, an ammonia water is applied on the surface of the copper layer 12, followed by the step of FIG. 3C wherein an acrylic resist 13 is applied on the surface of the copper layer 12.

It should be noted that the foregoing substrate 11 provides a support to the copper layer 12 and may be a slab or a flexible sheet of glass, ceramics, resin, metal or a composite material formed of arbitrary combination of these materials. Further, the substrate 11 may be any of a circuit substrate, multilayer substrate, semiconductor substrate, module substrate or a half product of these. The formation of the copper layer 12 may be conducted by any suitable means such as sputtering.

The application of the ammonia water on the surface of the copper layer 12 is preferably conducted by a spin coating process for uniform processing of the surface by the ammonia water. In such a spin coating process, the substrate 11 carrying thereon the copper layer 12 is mounted upon a chucking mechanism of a spin coater and a predetermined amount of ammonia water is supplied to the surface of the copper layer 12 thus mounted upon the spin coater. Upon revolution of the substrate 11 together with the chucking mechanism, the ammonia water thus supplied spreads uniformly over the surface of the copper layer 12 and the surface of the copper layer 12 experiences a uniform processing. Alternatively, one may dip the substrate 11 carrying thereon the copper layer 12 into a bath of the ammonia water for a predetermined duration.

After such an ammoniac processing, the surface of the copper layer 12 is dried and a layer of acrylic resist 13 is applied on the surface of the copper layer 12 according to a spin coating process as usual.

It should be noted that one can eliminate the process of drying when the ammonia water is applied to the surface of the copper layer 12 by the spin-coating process, as the removal of the ammonia water and hence the process of drying the copper layer surface is achieved simultaneously to the spreading of the ammonia water as a result of revolution of the substrate 11.

Preferably, the ammonia water used in the step of FIG. 3B contain ethanol for improving the wetting of the copper layer surface. By setting the concentration of the ammonia water (the concentration of ammonia in the ammonia water) to fall in the range of approximately 1–4 percent by weight, one obtains an advantageous effect of suppressing a gel formation caused as a result of reaction between ammonia and the acrylic resist, in addition to the foregoing improvement of the adherence of the acrylic resist upon the copper layer 12.

The foregoing process of the present invention is applicable to the fabrication of multilayer substrates as will be described in detail below with reference to a preferred embodiment of the present invention.

Next, an embodiment of the present invention will now be described with reference to FIGS. 4A–4H.

Figure 4A:
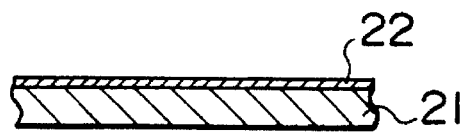
FIGS. 4A–4H are diagrams showing the process for forming a substrate of an electronic device according to an embodiment of the present invention.

Referring to FIG. 4A, a sputtering process is conducted to from an electrode layer 22 of copper on the surface of a substrate 21. As most part of the layer 22 has to be removed after the electroplating process as will be described later, the layer 22 is preferably formed as thin as possible, typically several hundred nanometers.

Figure 4B:

Next, an ammonia water is applied upon the surface of the electrode layer 22 in the step of FIG. 4B. Preferably, an ammonia water admixed with ethanol is employed for improving the wetting of the copper layer surface. In the present embodiment, the ammonia water has a concentration set to about 1 percent by weight. The ethanol, in turn, is admixed to the ammonia water with a proportion of 60 milliliter for 1 liter of the ammonia water. It should be noted that ethanol thus admixed to the ammonia water acts to reduce the surface tension of the ammonia water and improves the wetting of the surface of the electrode layer 22 by the ammonia water.

The foregoing step of FIG. 4B for applying the ammonia water is conducted by a spin coating process. More specifically, the substrate 21 is mounted upon a chucking mechanism of a spin coater and the foregoing ammonia water is supplied to the surface of the electrode layer 22 with a predetermined amount. After this, the spin coater is activated and the substrate 21 is revolved at a speed of about 3000 rpm. Thereby, the ammonia water spreads over the surface of the electrode layer 22 and forms a film of uniform thickness.

Figure 4C:
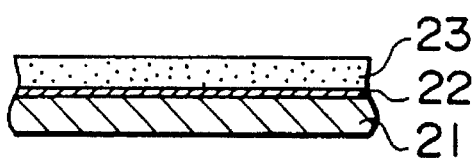

After the processing of the copper electrode layer 22 by the ammonia water, the step of FIG. 4C is conducted wherein an acrylic resist is applied on the surface of the layer 22 by a spin coating process to form a resist layer 23. In this spin coating process, the same spin coater used in the previous step of FIG. 4B is used without removing the substrate 21 from the chucking mechanism. Thereby, the unnecessary or extraneous step of dismounting the substrate 21 from the spin coater and mounting the same upon another spin coater is eliminated. In the illustrated example, it should be noted that the acrylic resist forming the resist layer 23 is a negative type resist. As a result of the processing of the copper electrode layer 22 by the ammonia water in the step of FIG. 4B, the adherence of the resist layer 23 upon the electrode layer 22 is substantially improved.

Figure 4D:
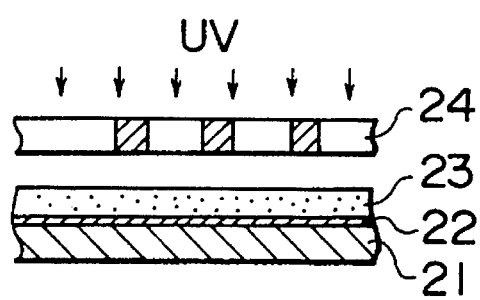

After the step of FIG. 4C, the resist layer 23 on the substrate 21 is subjected to a pre-exposure bake process conducted typically at 70°–90° C., followed by an exposure process in FIG. 4D conducted by ultraviolet radiation. As a result of such an exposure process, an exposure pattern of a photomask 24 is transferred upon the resist layer 23.

Figure 4E:
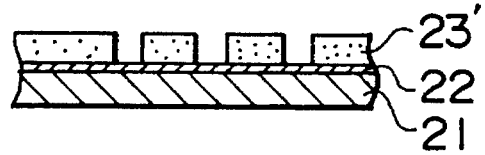

Next, in the step of FIG. 4E, the exposed photoresist layer 23 is subjected to a development process wherein the unexposed part of the resist layer 23 is dissolved by a developer solution. As a result of the development in the step of FIG. 4E, one obtains a resist pattern 23' on the surface of the copper electrode layer 22.

Figure 4F:
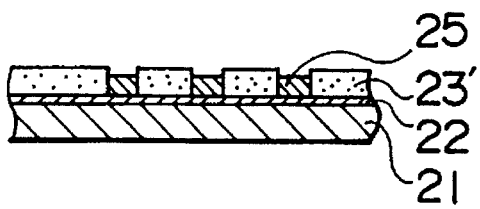

Further, in the step of FIG. 4F, an electroplating process is conducted while using the resist pattern 23' as a mask. More specifically, the substrate 21 carrying thereon the copper electrode layer 22 and the resist pattern 23' is dipped in a bath holding an electrolytic solution of copper, and a negative pole of a d.c. power supply is connected to the electrode layer 22 to cause a deposition of copper on the exposed surface of the electrode layer 22. As a result of such a deposition of copper, a copper interconnection pattern 25 is formed in correspondence to the exposed part of the copper layer 22. Typically, the copper interconnection pattern 25 is formed with a thickness of several microns, which is about 10 times as large as the thickness of the copper layer 22.

Figure 4G:
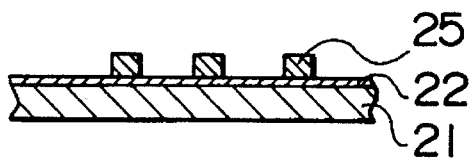
Figure 4H:
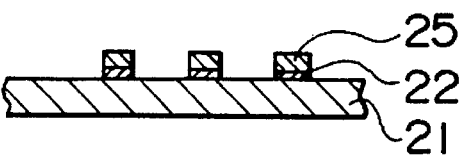

Next, in the step of FIG. 4G, the resist pattern 23' is removed by dissolving the same into an organic solvent. Thereby, one obtains a structure in which the copper layer 22 is exposed between the adjacent interconnection patterns 25. Further, an etching process is conducted in the step of FIG. 4H upon the structure of FIG. 4G such that the exposed copper layer 22 is removed. As the copper layer 22 is formed with a reduced thickness as compared with the copper interconnection pattern 25, the individual interconnection patterns 25 are separated electrically and provide the wiring of various elements provided on the substrate 21.

As a result of the foregoing ammoniac processing step of FIG. 4B, it was confirmed experimentally that the problem of penetration of the electrolyte used in the electroplating process of FIG. 4F into the gap between the copper electrode layer 22 and the resist pattern 23' thereon is substantially reduced.

More specifically, the inventor of the present invention has conducted an experiment for forming a line and space pattern, in which a line having a 50 μm width is repeated with a pitch of 50 μm, on a square substrate having a size of 6 inches for each edge. It was observed that the rate of occurrence of defects as a result of such a penetration of the electrolyte was 70% in the case where no ammoniac treatment of the copper electrode layer 22 is made, while the rate of occurrence of the defects has dropped to 3% when the treatment of the copper electrode layer 22 by the ammonia water shown in FIG. 4B is employed.

Thus, it was confirmed experimentally that the adherence of the acrylic resist upon the electrode layer is substantially improved as a result of the treatment of the copper electrode layer 22 by the ammonia water. Although the mechanism of the improvement of the adherence of the acrylic resist is not fully understood at the present juncture, it is thought probable that one or both of the following reactions take place as a result of the ammoniac treatment.

(A) The ammonia water reacts with the copper electrode layer 22 to form a layer of complex compound on the surface of the layer 22, while the layer of the complex compound thus formed reacts with the acrylic resist 23 to develop a firm bond between the electrode layer 22 and the acrylic resist layer 23.

(B) The ammonia water removes oxide or oxide film from the surface of the electrode layer 22, and the bare surface of the copper electrode layer 22 thus exposed establishes a firm bond with the acrylic resist layer 23 thereon.

In the experiment conducted by the inventor, it was also found that the adherence of the acrylic resist layer 23 upon the electrode layer 22 increases with increasing concentration of the ammonia water. However, it was found that excessive increase of the concentration of the ammonia water invites a gel formation as a result of reaction between the components forming the acrylic resist and ammonia in the ammonia water. It should be noted that such a gel formation provides a harmful effect upon the photosensitivity of the resist.

For example, gel formation of as much as 3 percent was observed when the concentration of the ammonia water is increased to 4 percent by weight. Although the rate of occurrence of the defective patterns as a result of invasion of the electrolyte is suppressed to zero (0%) as a result of use of the ammonia water having such a high concentration of ammonia, the observed gel formation of 3% is thought the allowable upper limit in view of the necessary photosensitivity of the resist. Thus, it is preferable to set the composition of the ammonia water used in the step of FIG. 4B to fall within the range of 1–4 percent by weight. When the ammonia concentration is set to 1 percent by weight, it was observed that the gel formation is in the order of 0.5 percent, wherein such a value of gel formation does not affect the photosensitivity of the resist. Here, it should be noted that the rate of gel formation used herein represents the volumetric proportion of the gels with respect to the entire volume of the resist.

As already noted, the admixing of ethanol into the ammonia water reduces the surface tension of the ammonia water on the electrode layer 22 and improves the wetting of the surface of the electrode layer 22 by the ammonia water. Thus, the use of ammonia water admixed with ethanol is suitable for processing the electrode layer provided on a multilayer substrate. It should be noted that the multilayer substrate generally has projections and depressions on the surface thereof and is difficult for uniform surface treatment. Of course, the proportion of ethanol admixed to the ammonia water is not limited to 60 milliliter for 1 liter of the ammonia water.

Further, the present invention is not limited to the embodiments described heretofore, but various variations and modifications may be made without departing from the scope of the invention.

What is claimed is:

1. A method for forming an acrylic resist on a surface of a copper layer, comprising the steps of:

processing a surface of said copper layer by an ammonia water comprising ethanol; and depositing a layer of acrylic resist on said surface of said copper layer after processing by said ammonia water.

2. A method as claimed in claim 1, wherein said ammonia water comprises a concentration of ammonia of 1 to 4 percent by weight of water.

3. A method as claimed in claim 1, wherein said step of processing the surface of said copper layer comprises a spin coating process of said ammonia water upon said surface of said copper layer.

4. A method for fabricating an electronic apparatus that includes a substrate carrying thereon a conductor pattern, comprising the steps of:

depositing a first copper layer on a substrate;

processing a surface of said first copper layer by an ammonia water comprising ethanol;

depositing a layer of acrylic resist on said surface of said first copper layer after said step for processing by said ammonia water;

exposing said layer of acrylic resist according to a desired conductor pattern to form a resist pattern of acrylic resist on said first copper layer;

depositing a second copper layer upon said first copper layer carrying thereon said pattern of acrylic resist by an electroplating process, while using said resist pattern as a mark;

removing said resist pattern after said step of depositing said second copper layer to expose said first copper pattern located underneath said resist pattern; and removing said first copper layer exposed after said step of removing said resist pattern.

5. The method as claimed in claim 4, wherein said ammonia water comprises a concentration of ammonia of 1 to 4 percent by weight of water.

6. A method as claimed in claim 4, wherein said step of processing the surface of said copper layer comprises a spin coating process of said ammonia water upon said surface of said copper layer.

7. A method as claimed in claim 6 wherein said step of depositing the layer of acrylic resist comprises a spin coating process of said acrylic resist, wherein said spin coating process of said ammonia water and said spin coating process of said acrylic resist are conducted in the same spin coater.

* * * * *